United States Patent [19]
McCormick

[11] Patent Number: 5,811,505
[45] Date of Patent: Sep. 22, 1998

[54] ENERGY-POLYMERIZABLE COMPOSITIONS COMPRISING A CYANATE ESTER MONOMER OR OLIGOMER AND A POLYOL

[75] Inventor: Fred B. McCormick, Maplewood, Minn.

[73] Assignee: Minnesota Mining and Manufacturing Company, St. Paul, Minn.

[21] Appl. No.: 992,592

[22] Filed: Dec. 17, 1997

Related U.S. Application Data

[62] Division of Ser. No. 400,053, Mar. 3, 1995, Pat. No. 5,741,879.

[51] Int. Cl.$^6$ ............................... C08G 18/08; C08F 2/46
[52] U.S. Cl. .............................. 528/55; 528/48; 528/51; 528/52; 528/56; 528/66; 528/76; 528/85; 522/4; 522/6; 522/28; 522/29; 522/33; 522/38; 522/39; 522/81; 522/82; 522/90; 524/115; 524/174; 524/176; 524/177; 524/178
[58] Field of Search .................................. 528/48, 51, 52, 528/55, 56, 66, 76, 85; 522/4, 6, 28, 29, 33, 38, 39, 81, 82, 90; 524/115, 174, 176, 177, 178

[56] References Cited

U.S. PATENT DOCUMENTS

| | | | |
|---|---|---|---|
| 3,491,060 | 1/1970 | Schminke et al. | 260/47 |
| 3,694,410 | 9/1972 | Oehmke | 260/47 |
| 4,026,913 | 5/1977 | Tanigaichi et al. | 260/463 |
| 4,195,132 | 3/1980 | Sundermann et al. | 521/155 |
| 4,369,304 | 1/1983 | Gaku et al. | 528/322 |
| 4,383,903 | 5/1983 | Ayano et al. | 204/159.16 |
| 4,429,112 | 1/1984 | Gaku et al. | 528/422 |
| 4,631,319 | 12/1986 | Blahak et al. | 525/437 |
| 4,677,137 | 6/1987 | Bany et al. | 522/31 |
| 4,754,001 | 6/1988 | Blahak et al. | 525/437 |
| 4,902,752 | 2/1990 | Shimp | 525/390 |
| 4,980,449 | 12/1990 | Kohn et al. | 528/211 |
| 5,089,555 | 2/1992 | Kitagawa et al. | 524/503 |
| 5,215,860 | 6/1993 | McCormick et al. | 430/270 |
| 5,264,537 | 11/1993 | Kohn et al. | 528/211 |
| 5,294,517 | 3/1994 | McCormick et al. | 430/270 |
| 5,350,635 | 9/1994 | Pokorny | 428/414 |

*Primary Examiner*—Samuel A. Acquah
*Attorney, Agent, or Firm*—Daniel C. Schulte

[57] ABSTRACT

An energy-polymerizable composition derived from ingredients comprising: a cyanate ester monomer or oligomer comprising an organic radical bonded through aromatic carbon atoms to at least two —OCN groups; a low molecular weight polyalkylene glycol; and an organometallic compound in which at least one carbon atom of an organic group is bonded to a metal atom. The composition can be cured by at least one of thermal energy, radiation, and accelerated particles, to produce a cured, homogeneous composition.

21 Claims, No Drawings

ENERGY-POLYMERIZABLE COMPOSITIONS COMPRISING A CYANATE ESTER MONOMER OR OLIGOMER AND A POLYOL

This is a division of application Ser. No. 08/400,053 filed Mar. 3, 1995 now U.S. Pat. No. 5,741,879.

FIELD OF THE INVENTION

This invention relates to energy-polymerizable compositions comprising cyanate ester monomers, a polyol, and an organometallic compound, and a method therefor. This invention relates in particular to energy-polymerizable compositions useful in applications requiring high performance, such as high temperature stability.

BACKGROUND OF THE INVENTION

Industry is constantly searching for lighter, stronger, and more resistant materials. Cyanate ester monomers, especially polyfunctional cyanate ester monomers, can be cured to form thermally stable, chemically inert, solvent resistant reaction products that have desirable dielectric properties. Cyanate ester monomers can be cured in the presence of a catalyst. Effective catalysts include strong Lewis acids such as $AlCl_3$ and $BF_3$, protonic acids such as HCl and $H_3PO_4$, amines such as triethylamine and diazabicyclo[2.2.2]octane, tin octoate, zinc naphthenate, and various other materials such as sodium hydroxide, phosphines, phenols, imidazoles, metal acetylacetonates, organic peroxides, carboxylic acid anhydrides, and organic azo compounds. Additionally, U.S. Pat. No. 5,215,860 describes the use of organometallic catalysts to cure cyanate compositions.

A problem with cyanate ester reaction products is that their high performance characteristics are often offset by other negative properties; e.g. brittleness. Various strategies have been proposed to expand the utility of cyanate resins.

A proposed method of improving the properties of cured cyanate ester monomers is by adding a polyol to the cyanate. It has long been known that cyanate esters may be reacted with polyvalent hydroxyl compounds to form polyimidocarbonic esters of the general formula:

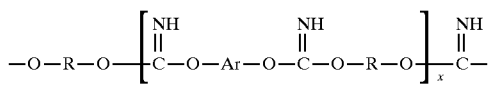

where R is the organic backbone of the polyol and Ar is the aromatic backbone of the cyanate ester. Such polymers are known to be hydrolytically unstable.

In U.S. Pat. No. 4,195,132, polyether polyols are reacted with cyanate ester monomers. These reaction products however, are disclosed to comprise two inseparable layers or phases which differ in their physical properties. Phase separation of such a gross scale severely limits the utility of these reaction products. What is needed therefore, but what is not taught in the art, is a homogeneous reaction product of cyanate ester monomers and polyols that has high performance properties.

The reaction product of cyanate ester monomers with an alcohol is unpredictable. The presence of a catalyst adds to this unpredictability. For example, a different reaction product will be obtained if a cyanate monomer is reacted with a polyol in the presence of a basic catalyst, than if the reaction takes place in the presence of an acidic catalyst (see Dieter Martin, and Radu Bacaloglu, Organische Synthesen mit Cyansaureestern, (Akademie-Verlag, Berlin 1980); Dieter Martin, Karl-Heinz Schwarz, Sabine Rackow, Peter Reich, and Egon Grundemann, Struktur und Reaktivitat von 2-Amino-2-aryloxy-1.1-dicyan-athylenen und 2-Amino-2-aryloxy-1-athoxycarbonyl-1-cyan-athylenen, Chem. Ber. 99 31, 2302, (1966)).

The reaction between a cyanate ester monomer or oligomer, and a polyol, in the presence of an organometallic catalyst, could in theory produce any number of different and unpredicted reaction products. Organometallic compounds are known to be effective as catalysts for the cyclotrimerization of cyanate esters. If, as is theoretically possible, the organometallic catalyst caused only the cyclotrimerization of the cyanate ester, a reaction between the cyanate ester monomer and the polyol could not take place. Instead, the resultant reaction product would be a mixture of polytriazines and essentially unreacted polyalkylene glycol.

Alternatively, an organometallic compound may be inhibited by a polyol. For instance the polyether backbone of a polyalkylene glycol might in theory coordinate with an organometallic catalyst as multidentate ligands. If this were to occur, the coordination sites at the metal center of the organometallic catalyst would be effectively blocked, and the organometallic catalyst would be inactivated from facilitating the reaction between the polyol and the cyanate monomer. Again, the desired reaction would not occur. Thus, there are many possible reaction products that might be formed by reacting a cyanate ester with a polyol in the presence of an organometallic catalyst.

SUMMARY OF THE INVENTION

The present invention provides an energy-curable composition of a polyol, a cyanate ester monomer or oligomer, and an organometallic catalyst, to provide a useful, homogeneous, cured composition. These homogeneous reaction products are photoimagable and water and temperature resistant. Further, the homogeneous reaction products display a wide range of physical properties, such as tensile strength, and other rheological properties.

With the use of organometallic catalysts, the energy-polymerizable composition of the present invention can be cured by at least one of thermal radiation energy, electromagnetic radiation (i.e., they are photoreactive), and accelerated particles. Radiation processing greatly expands the utility and potential applications of cyanate ester monomers and oligomers by allowing greater processing flexibility, e.g., curing at faster rates or lower temperatures, or by a two-stage curing process (photoactivation followed by heating). Additionally, the organometallic compounds used as catalysts show superior solubility and latentcy characteristics, and can be used at lower percentages and without the need for solvents; i.e., in compositions of 100% solids.

An aspect of the present invention is an energy-polymerizable composition comprising: a cyanate ester monomer or oligomer comprising an organic radical bonded through aromatic carbon atoms to at least two —OCN groups; a polyol; and an organometallic compound in which at least one carbon atom of an organic group is bonded to a metal atom. Preferably, the polyol is a low molecular weight polyalkylene glycol. Most preferably, the polyalkylene glycol has a repeating polyalkylene unit that contains 2, 3, or 4 carbon atoms.

A further aspect of the present invention is a cured, homogeneous composition derived from the above energy-polymerizable composition.

Yet a further aspect of the present invention is a method of producing the above cured, homogeneous composition. This method may be accomplished in a single, or in multiple steps.

In this application:

an "aromatic carbon atom" is a carbon atom that is a member of an aromatic ring;

"catalytically-effective amount" means a quantity sufficient to effect polymerization of an energy-polymerizable composition to a polymerized product at least to a degree to cause an increase in the viscosity of the composition;

"energy-polymerizable" means curable by means of electromagnetic radiation (ultraviolet and visible) accelerated particles (including electron beam), and/or thermal (infrared and heat) means;

"homogeneous" means lacking in gross or macroscopic phase separation such as inseparable layers or pools of one material suspended in another that are clearly visible to the unaided eye; microscopic phase separation invisible to the unaided eye and only measurable by instrumental techniques, or visible as mere turbidity, haze, cloudiness, translucency, or opacity, is within the scope of this definition;

"organometallic compound" means a salt or covalently bonded compound in which at least one carbon atom of an organic group is bonded to a metal atom (see "Basic Inorganic Chemistry", F. A. Cotton, G. Wilkinson, Wiley, N.Y., 1976, p.497).

DESCRIPTION OF THE PREFERRED EMBODIMENTS

The present invention provides an energy-polymerizable composition comprising a cyanate ester monomer or oligomer, a polyol, and an organometallic compound as a catalyst or cure agent. The ingredients of the energy-polymerizable composition can be polymerized to produce a cured, homogeneous composition.

Cyanate ester monomers useful in the practice of the present invention comprise at least two —OCN group, and are given by the general formula $$Q(OCN)_p \quad (I)$$

where p is an integer from 2 to 7, and wherein Q comprises a mono-, di-, tri-, or tetravalent aromatic hydrocarbon containing from 5 to 30 carbon atoms and zero to 5 aliphatic, cyclic aliphatic, or polycyclic aliphatic, mono-, di-, or trivalent hydrocarbon linking groups containing 7 to 20 carbon atoms. Optionally, Q may comprise 1 to 10 heteroatoms selected from the group consisting of non-peroxidic oxygen, sulfur, non-phosphino phosphorus, non-amino nitrogen, halogen, and silicon. In general, any mono-, di-, or polyfunctional phenolic compound reacted with cyanogen halide in the presence of a base to form a mono-, di-, or polyfunctional aromatic cyanate ester compound may be useful in the present invention.

In the practice of the present invention monomers of formula I may be partially cyclotrimerized to produce useful oligomers. Also, cyanate ester monomers, and oligomers thereof, may be used in combination with other cyanate ester monomers and/or oligomers. Optionally, useful combinations may also comprise one or more monofunctional cyanate ester monomers (i.e., p in formula I is one).

Examples of useful cyanate ester monomers and oligomers include, but are not limited to: 1,3- and 1,4-dicyanatobenzene; 2-tert-butyl-1,4-dicyanatobenzene; 2,4-dimethyl-1,3-dicyanatobenzene; 2,5-di-tert-butyl-1,4-dicyanatobenzene; tetramethyl-1,4-dicyanatobenzene; 4-chloro-1,3-dicyanatobenzene; 1,3,5-tricyanatobenzene; 2,2'- or 4,4'-dicyanatobiphenyl; 3,3',5,5'-tetramethyl4,4'-dicyanatobiphenyl; 1,3-, 1,4-, 1,5-, 1,6-, 1,8-, 2,6-, or 2,7-dicyanatonaphthalene; 1,3,6-tricyanatonaphthalene; bis(4-cyanatophenyl)methane; 2,2-bis(4-cyanatophenyl)propane (AroCY™ B-10 commercially available from Ciba Matrix Resins, Hawthorne, N.J., Skylex™ resins available from Mitsubishi Gas Chemical Co., Tokyo); partially cyclotrimerized oligomers, such as AroCy™ B-30 or B-50 (Ciba) where approximately 30 and 50% of the cyanate ester groups of AroCy™ B-10 have been cyclotrimerized; 1,1,1-tris(4-cyanatophenyl)ethane; 1,1-bis-(4-cyanatophenyl) ethane (AroCy™ L-10); bis(3,5-dimethyl-4-cyanatophenyl) methane (AroCy™ M-10); partially cyclotrimerized oligomers of M-10, such as AroCy™ M-20, M-30, and M-50; 2,2-bis(3,5-dichloro-4-cyanatophenyl)propane; 2,2-bis(3,5-dibromo-4-cyanatophenyl)propane; bis(4-cyanatophenyl)ether; 4,4'-(1,3-phenylenediisopropylidene) diphenylcyanate (AroCy™ XU-366); partially cyclotrimerized oligomers of XU-366, such as AroCy XU-378; bis(4-cyanato-phenyl)ketone; bis(4-cyanatophenyl)thioether; bis(4-cyanatophenyl)sulfone; tris (4-cyanato-phenyl)phosphite; tris(4-cyanatophenyl) phosphate; cyanated novolac oligomers having the general formula:

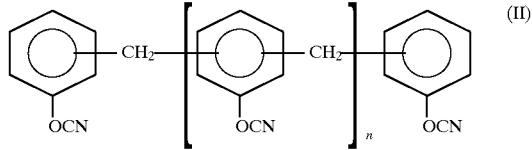

wherein n is 4 or less, preferably 2 or less, including Primaset™ PT-30, PT-60, PT-90, (all commercially available from Allied-Signal Inc.), and AroCy XU-371 (commercially available from Ciba Matrix); and polyaromatic cyanate ester oligomers comprising polycyclic aliphatic diradicals, having the general formula:

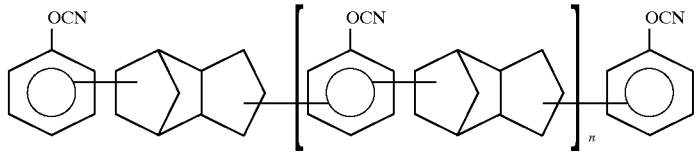

wherein n is 4 or less, preferably 2 or less, including Quatrex™ 7187, (available from Dow Chemical).

Preferred cyanate ester monomers and oligomers are those that exist as a liquid, or that exhibit a low melting temperature, e.g., below about 90° C.

Liquid or low melting cyanates ester monomers and oligomers may be used individually or in combination with other cyanates ester monomers or oligomers provided that the resulting combination is also a liquid or low melting composition.

Examples of preferred cyanate ester monomers and oligomers include, but are not limited to: 1,1-bis-(4- cyanatophenyl)ethane (AroCy™ L-10), 2,2-bis(4-cyanatophenyl)propane (AroCy B-10), bis(3,5-dimethyl-4-cyanatophenyl)methane (AroCy™ M-10), 4,4'-(1,3-phenylenediisopropylidene)diphenylcyanate (AroCy XU-366), cyanated novolac oligomers, e.g., those of formula II, and polyaromatic cyanate ester oligomers comprising polycyclic aliphatic diradicals, e.g., those of formula III.

In the practice of the present invention, useful polyols are organic molecules containing two or more hydroxy groups, that react with a cyanate ester monomer or oligomer in the presence of an organometallic compound to form a homogeneous reaction product; especially those polyols containing from 2 to 5, and most especially 2 or 3, hydroxyl groups. Preferably, the polyol has a relatively low average molecular weight, e.g., below about 10,000 (as used herein, average molecular weight refers to number average, or $M_n$). In the practice of the present invention, preferred polyols are polyalkylene glycols containing 2 or 3 hydroxyl groups. Examples of preferred polyalkylene glycols include, but are not limited to polyethylene glycols, polypropylene glycols, polypropylene glycol triols, and polybutylene glycols. These preferred polyalkylene glycols have a repeating polyalkylene unit that contains either 2, 3, or 4 carbon atoms. Any of the repeating polyaklylene units may exist in the backbone of the polyol as a linear segment, e.g., —$CH_2CH_2CH_2CH_2$—, or in any isomeric form, e.g., —$CH_2CH_2CH(CH_3)$—.

Useful polyethylene glycols have average molecular weights ranging from about 100 to about 10,000, preferably from about 100 to 5,000, and most preferably from about 200 to 4,000. Useful polypropylene glycols have an average molecular weight in the range from about 150 to about 10,000, preferably from about 150 to 5,000, and most preferably from about 400 to 4,000. Useful polypropylene glycol triols have an average molecular weight in the range from about 150 to about 10,000, preferably from about 200 to 8,000, and most preferably from about 300 to 6,000. Useful polybutylene glycols have an with average molecular weight in the range from about 200 to about 10,000, preferably from about 200 to 5,000, and most preferably from about 600 to 3,000.

Polyalkylene glycols are available from numerous commercial sources including Union Carbide, Dow Chemical, and Aldrich Chemical. Alternatively, polyalkylene glycols may be obtained by polymerizing epoxides, such as ethylene oxide, propylene oxide, and butylene oxide, either on their own, for example, in the presence of $BF_3$, or by the addition of these epoxides, optionally in admixture or in succession, to starter components containing reactive hydrogen atoms, such as water, alcohols, or amines. Examples of starter components include ethylene glycol, 1,2-, or 1,3-propylene glycol, trimethylol propane, 2,2-bis(4-hydroxyphenyl) propane, aniline, ammonia, ethanol amine, and ethylene diamine. The polyalkylene glycols may be used individually or in combination, or may be mixed with other polyol compounds that are soluble in the polyalkylene glycols.

The amount of polyol used for a given amount of cyanate ester monomers or oligomers will vary greatly depending on the desired reaction product. Useful weight ratios of cyanate ester monomer to polyol are in the range from 1:99 to 99:1.

More specifically, a relatively greater amount of polyol reacted with relatively fewer cyanate ester monomers or oligomers will result in a reaction product of a viscous fluid with little or no internal strength or integrity. This type of reaction product is useful as an additive in other polymeric compositions as a plasticizer or a crosslinker. Useful weight ratios of cyanate ester monomer and/or oligomers to polyol for these applications are in the range from 1:99 to 20:80.

When the relative amount of cyanate ester monomers or oligomers and polyol are similar, flexible compositions with high elongation properties are obtained. These types of reaction product are useful for films for packaging, gasketing materials, conformal coatings, and protective coatings. Useful weight ratios of cyanate ester monomer and/or oligomers to polyol for these applications are in the range from 20:80 to 60:40.

When the amount of cyanate ester monomers or oligomers is high relative to the polyol, hard and strong reaction products are obtained. These types of reaction products have relatively low elongation character but are considerably more flexible than cyanate esters monomers or oligomers cured in the absence of a polyol. These "toughened" cyanate ester reaction products are useful, for example, as matrix resins for structural composites, structural adhesives, circuit board laminates, and molding resins. Useful weight ratios of cyanate ester monomers and/or oligomers to polyol for these applications are in the range from 60:40 to 99:1.

In the practice of the present invention, the energy-polymerizable composition is cured or polymerized in the presence of an organometallic compound; that is, a compound containing at least one transition metal to carbon covalent bond, with the general formula $$[L^1L^2L^3M]^{+e}X_f \qquad (IV)$$

wherein:

$L^1$ represents none or 1 to 12 ligands contributing pi-electrons that can be the same or different, and are selected from cyclic or acyclic aromatic, heteroaromatic, or unsaturated compounds and groups, each capable of contributing 2 to 24 pi-electrons to the valence shell of M;

$L^2$ represents none or 1 to 24 ligands that can be the same or different, each contributing 2, 4, or 6 electrons selected from mono-, di-, and tridentate ligands to the valence shell of M;

$L^3$ represents none or 1 to 12 ligands that can be the same or different, each contributing no more than one electron to the valence shell of each M;

M represents from 1 to 6 of the same or different metal atoms selected from Ti, Zr, Hf, V, Nb, Ta, Cr, Mo, W, Mn, Tc, Re, Fe, Ru, Os, Co, Rh, Ir, Ni, Pd, and Pt which are commonly referred to as the transition metals;

e is an integer from 0 to 2 such that the organometallic portion of the molecule is neutral, cationic, or dicationic;

X is an anion selected from organic sulfonate and halogenated, alkylated, or arylated metal or metalloid groups;

f is an integer from 0 to 2 and is the number of anions required to balance the charge e on the organometallic portion of the molecule;

with the proviso that the organometallic compound contains at least one transition metal to carbon bond and that $L^1$, $L^2$, $L^3$, M, e, X, and f are chosen so as to achieve stable electronic configuration.

Illustrative examples of $L^1$ include ethylene, cyclohexane, acetylene, eta$^5$-cyclopentadienyl, cyclooctadiene, benzene, and pyrene. Illustrative examples of $L^2$ include carbon monoxide, triphenylphosphine, acetonitrile, and 1,2-bis (diphenylphosphino)ethane. Illustrative examples of $L^3$ include methyl, vinyl, triphenyl tin, and acetyl groups. Illustrative examples of X include $CF_3SO_3^-$, $(C_6H_5)_4B^-$, $BF_4^-$, $PF_6^-$, $AsF_6^-$, $SbF_6^-$, and $SbF_5OH^-$.

Organometallic compounds according to formula IV have been more completely described in U.S. Pat. No. 5,215,860 (incorporated herein by reference). Illustrative examples of these catalysts include, but are not limited to $Cr(CO)_6$, $Mn_2(CO)_{10}$, $(CO)_5ReBr$, $[CpFe(CO)_2]_2$ ($Cp=eta^5-C_5H_5$), $CpFe(CO)_2I$, $MeCpMn(CO)_3$ ($MeCp=eta^5-C_5H_4CH_3$), $MeCpMn(CO)_2PPh_3$ ($Ph=C_6H_5$), $[MeCpMn(CO)_2NO]$ $PF_6$, $[CpFe(xylene)][SbF_6]$, $[CpFe(pyrene)][SbF_6]$, $[Fe(mesitylene)_2][PF_6]_2$, $[Fe(mesitylene)_2][SbF_6]_2$, $[CpFe(CO)_3]BF_4$, bicyclo[2.2.1]hepta-2,5-diene molybdenum tetracarbonyl, $Cp_2TiCl_2$, $CpFe(CO)_2Cl$, $[CpW(CO)_3]_2$, $CpMn(CO)_2PPh_3$, (anisole)$Cr(CO)_3$, $Mn(CO)_5Br$, (benzene)$Cr(CO)_3$, $[CpMo(CO)_3]_2$, $[MeCpMo(CO)_3]_2$, $[Cp*Fe(CO)_2]_2$ ($Cp*=eta^5-C_5(CH_3)_5$), $CpFe(CO)_2SnPh_3$, $(CO)_5MnSnPh_3$, $CpMn(CO)_3$ $[(benzene)Mn(CO)_3][PF_6]$, $[(p-cymene)RuCl_2]_2$, $[CpFe(cumene)][PF_6]$, and $[CpFe(benzene)][PF6]$.

Preferred examples of catalysts according to formula IV include, but are not limited to: $[CpFe(CO)_2]_2$, $Mn_2(CO)_{10}$, $[MeCpMo(CO)_3]_2$, $[CpFe(xylene)][SbF_6]$, $[CpFe(cumene)][PF_6]$, $MeCpMn(CO)_3$, $CpFe(CO)_2Cl$, (benzene)$Cr(CO)_3$, $Cp_2TiCl_2$, $MeCpMn(CO)_2PPh_3$, $Mn(CO)_5Br$, $[MeCpMn(CO)_2NO]PF_6$, and (anisole)$Cr(CO)_3$.

Organometallic compounds useful in the practice of the present invention are available from Strem Chemical Co. (Newburyport, Mass.) or can be prepared by literature methods known to those skilled in the art. See for example Dictionary of Organometallic Compounds (Chapman and Hill Ltd. 1984); Comprehensive Organometallic Chemistry, The Synthesis, Reactions and Structures of Organometallic Compounds (Pergamon 1982).

The organometallic compounds can be present in a catalytically effective amount, preferably in the range of 0.01 to 20, most preferably 0.1 to 5, parts by weight (pbw) based on 100 parts of the energy-polymerizable composition. In some applications it may be desirable to sorb the organometallic compound onto an inert support such as silica, alumina, clays, etc., as described in U.S. Pat. No. 4,677,137.

In the method of the present invention the cyanates ester monomers or oligomers, polyols, and curing agents may be mixed together in any order, at ambient or slightly elevated temperatures e.g., 70° C., to provide a homogeneous, energy-polymerizable composition which may thereafter be processed according to a particular application, i.e., coated onto a substrate, placed into a mold, etc. This homogeneous composition may then be polymerized (i.e., cured) by exposure to energy in the form of heat and/or light. The energy will cure or polymerize the homogeneous energy-polymerizable composition (as used herein, the term "polymerize" also includes a copolymerization reaction), to produce a cured, homogeneous composition. While not wishing to be bound by theory, it is believed that the polyols of the present invention react with cyanate ester monomers and/or oligomers in the presence of an organometallic compound via cyclotrimerization to form triazine networks that are further crosslinked by the backbones of the polyol molecules. The result is a homogeneous reaction product that, because it lacks gross phase separation, is useful in applications requiring high performance properties, such as high temperature resistance, inertness, durability, etc.

To produce an energy-curable composition with extended shelf life, the cyanate ester monomers or oligomers and polyols may be mixed together prior to addition of the organometallic compound. In the absence of the organometallic compound, little or no curing takes place at ambient (around 20° C.) temperatures. The organometallic compound may be added immediately prior to the desired curing operation.

Alternatively, the organometallic compound may be first mixed (dissolved or suspended) with the polyol. This provides a two-part energy-polymerizable composition where the cyanate ester monomers or oligomers are subsequently mixed with the organometallic compound/polyol mixture immediately prior to the desired curing operation. Optionally, the cyanate ester monomers or oligomers may also be mixed with a polyol. Mixing immediately prior to cure could be accomplished by hand or by any of several mechanical mixing methods such as a baffled mixing nozzle.

It may be desirable to protect the energy polymerizable composition of the present invention from light and heat by use of shielding or filters known in the art until polymerization and cure are desired.

It may also be desirable to add solvent to solubilize components and aid in processing. Solvents, preferably organic solvents, can be present in an amount up to 99 parts by weight (pbw), but preferably in the range from 0 to 90 pbw, more preferably in the range of 0 to 75 pbw, based on 100 parts of the energy-curable composition. It is most preferred to use no solvent at all; that is, the energy-polymerizable composition consists of 100% solids. However, where a solvent is used, representative solvents include acetone, methyl ethyl ketone, tetrahydrofuran, cyclopentanone, methyl cellosolve acetate, methylene chloride, nitromethane, methyl formate, acetonitrile, gamma-butyolactone, and 1,2-dimethoxyethane (glyme).

In general, thermally induced polymerization of the energy-polymerizable composition of the present invention may be carried out at 20° to 300° C., preferably 60° to 200° C., although low temperature (e.g., 20° to 60° C.) or elevated temperature (e.g., 200° to 300° C.) can be used to subdue the exotherm of polymerization or to accelerate the polymerization, respectively.

Temperature of polymerization and amount of organometallic compound (catalyst) will vary and be dependent on the particular energy-polymerizable composition used, and on the desired application of the polymerized or cured product. The amount of organometallic compound present should be sufficient to effect polymerization of the cyanate ester monomers or oligomers and polyols (i.e., a catalytically effective amount) under the desired use conditions. Such amount will generally be in the range from about 0.01 to 20 pbw, and preferably 0.1 to 5 pbw, based on 100 parts of energy-polymerizable mixture.

Radiation induced cure can be accomplished by any source of radiation which will cause polymerization of cyanate ester monomers or oligomers and a polyol in the presence of an organometallic compound. For example, suitable radiation sources include those that emit electron beam radiation and active radiation in the ultraviolet and visible region of the spectrum (e.g., about 200 to 800 nm). Suitable sources of radiation include mercury vapor discharge lamps, carbon arcs, tungsten lamps, xenon lamps, lasers, sunlight, etc. The required amount to effect polymerization is dependent upon such factors as the identity and concentration of the organometallic compound, the particular cyanate ester monomers or oligomers and polyol comprising the energy-polymerizable composition, the thickness of the exposed material, the type of substrate, intensity of the radiation source, and the amount of heat associated with the radiation.

Thermal polymerization using direct heating or infrared electromagnetic radiation, as is known in the art, can be used to cure the energy-polymerizable compositions of the present invention.

For certain applications, e.g., photoresists or solder masks, exposure of coatings of the energy-polymerizable cyanate ester/polyol compositions through a mask, such as a photolithographic mask, will provide cured coatings in the negative image of the mask.

The energy-polymerizable composition of the present invention may be cured by a single step process, or by multiple step curing processes. One type of multi-step curing process, includes the controlled heating and/or irradiation of the energy-polymerizable composition, to partially cure the composition, thereby producing oligomers of relatively low molecular weight. Removal of the heat and/or light sources will quench the polymerization. Optionally, other ingredients can be added to the partially cured composition and the curing resumed by applying additional heat and/or light.

It is also possible to accomplish a multiple-step cure process by a first irradiation step wherein the organometallic compound is activated to produce an activated composition, followed by a thermal step wherein the activated composition is polymerized.

The initial irradiation step includes the process of irradiating the energy-polymerizable composition with energy of a wavelength that will activate the organometallic compound by inducing a ligand exchange reaction, to produce vacant coordination sites on the organometallic compound where polymerization of the polyol and cyanate ester monomer and/or oligomer may take place. The appropriate wavelength of the irradiation will depend, among other things, upon the specific organometallic compound to be activated. This irradiation step is accomplished at a temperature where no polymerization will take place.

It is then possible, in the thermal step, to subsequently thermally polymerize the activated composition obtained in the irradiation step. The activated composition may normally be heat/thermally polymerized at temperatures which are substantially lower than those required for direct thermal polymerization, typically at temperatures that are from 20° C. to 200° C. lower than are required for curing without activation of the organometallic compound. This two-stage curing also makes it possible to control the polymerization in a particularly simple and advantageous manner.

The cured compositions of the present invention may vary in color from essentially colorless to dark brown. Regardless of coloration, the compositions are usually transparent or translucent in keeping with their homogeneous nature.

Adjuvants such as solvents, thermoplastics, pigments, electrically and/or thermally conductive particles, abrasive particles, stabilizers, antioxidants, inert fillers, binders, plasticizers, fungicides, bactericides, surfactants, blowing agents, and other additives as known to those skilled in the art can be added to the compositions of this invention.

The objects and advantages of the present invention are further illustrated by the following examples, but the particular materials and amounts thereof recited in these examples, as well as other conditions and details, should not be construed to unduly limit this invention. All materials are commercially available or known to those skilled in the art unless otherwise stated or apparent.

EXAMPLE 1

Various cyanate ester resins and polyols were mixed to give homogeneous solutions as indicated in Table 1 (the values given in Table 1 indicate the relative amount, by weight, of each component used). To each solution was added 0.2% by weight MeCpMn(CO)$_3$ catalyst. A one gram (g) aliquot of each of the samples in Table 1 was placed in an aluminum weighing pan and irradiated with the light from 1 (one) 15 watt fluorescent black light (BLE-1800B from Spectronics Corp., Westbury, N.Y., 365 nm output) placed at distance of ¾ inch from the sample. The pans containing the irradiated samples were heated to 100° C. for 30 minutes followed by 150° C. for 30 minutes in ovens. After cooling to ambient temperature the samples were examined for cure and phase behavior.

TABLE 1

| | \multicolumn{15}{c}{Sample Number} |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| Cyanates* | | | | | | | | | | | | | | | |
| AroCy L10 | | 5 | 6 | | | | 5 | | 5 | 8 | 14 | 5 | 7 | 7 | 5 |
| AroCy XU366 | 5 | | | 6 | | 5 | 5 | 5 | | | | 2 | | | |
| AroCy XU378 | | | | | 5 | | | | | | | | | | |
| Primaset PT30 | | | | | | | | | 5 | | | | | | |
| Polyols** | | | | | | | | | | | | | | | |
| PEG400 | | | | 4 | 4 | | | | | | | | 2 | | |
| PEG1500 | | | | | | | | | | | 2 | | 1 | | |
| PEG3400 | | | | | | | | | | | | 1 | | | |
| PPG425 | | | | | | 5 | | | | 5 | | 5 | 2 | | 2 |
| PPG725 | | 5 | | | | | | | | | | | | | |
| PPG1000 | | | | | | | | | 5 | | | | 1 | | 1 |
| PPG4000 | | | | | | | | 5 | | | | | | | |
| PPGT1000 | | | 5 | | | | | | | | | | | | |
| PPGT6000 | | | | | | | | | | 5 | | | | | |
| PTHF650 | | | | | | | | | | | | | | | 5 |

*commercial cyanate ester resins: L10, XU366, and XU378 from Ciba; PT30 from Allied-Signal.
**commercial polyols, all obtained from Aldrich. PEG = polyethylene glycol, PPG = polypropylene glycol, PPGT = polypropylene glycol triol, PTHF = polytetrahydrofuran (a polybutylene glycol). The numbers following the polyol abbreviations refer to the number average molecular weight.

All of samples 1–15 from Table 1 cured to solid films which were amber colored and optically clear to the unaided eye. Samples 1, 4, 5, 6, 7, and 8 all gave soft films. Samples 2 and 3 gave tough, flexible films. Samples 9, 10, 11, 12, 13, 14, and 15 all gave hard, glassy films. This example showed that homogeneous reaction products were obtained from the reaction of a variety of cyanate esters monomers with polyethylene glycols, polypropylene glycols, polypropylene triols, and polybutylene glycols. The example further showed that the cyanate and polyol components may be used in a wide range of combinations.

EXAMPLE 2

A homogeneous solution was prepared from 70 g L10 and 30 g PPG425. Five gram aliquots of this solution were measured into 17 separate 2 dram glass vials and 0.01 g of a different organometallic compound (catalyst) was added to each vial. The vials were agitated on a roller table for 18 hours to dissolve the organometallic compound.

The samples contained the following organometallic compounds: 1) $MeCpMn(CO)_2PPh_3$, 2) $(benzene)Cr(CO)_3$, 3) $(anisole)Cr(CO)_3$, 4) $CpFe(CO)_2Cl$, 5) $[MeCpMo(CO)_3]_2$, 6) $[CpW(CO)_3]_2$, 7) $[(mesitylene)_2Fe][SbF_6]_2$, 8) $Cp_2TiCl_2$, 9) $[CpFe(CO)_3][PF_6]$, 10) $MeCpMn(CO)_3$, 11) $[CpFe(xylene)][SbF_6]$, 12) $Mn_2(CO)_{10}$, 13) $[CpFe(CO)_2]_2$, 14) $[(benzene)Mn(CO)_3][PF_6]$, 15) $[MeCpMn(CO)_2NO][PF_6]$, 16) $Mn(CO)_5Br$, and 17) $[CpFe(cumene)][PF_6]$.

One gram of each of the 17 catalyzed samples and one gram of the uncatalyzed 7/3 L10/PPG425 solution was placed in separate aluminum weighing pans which were placed in a 150° C. oven for 30 minutes. After cooling to ambient temperatures, the samples were examined for cure and phase behavior. The uncatalyzed sample was still a liquid, although it appeared to be somewhat more viscous than it was before heating. Sample six (6) containing $[CPW(CO)_3]_2$ catalyst was a very viscous syrup after heating. The remaining samples had cured to homogenous, optically clear, hard glassy films after heating. Sample 6 was placed in a 200° C. oven for 5 minutes. After cooling to ambient temperature, the sample had cured to a homogenous, optically clear, hard glassy film.

This example showed that organometallic catalysts were beneficial in accelerating the cure of cyanate/polyol compositions. This example further showed that a wide variety of organometallic compounds were effective catalysts in providing homogeneous reaction products upon curing.

EXAMPLE 3

Six parts of AroCy L-10 liquid cyanate ester was mixed with 4 parts of liquid polypropylene glycol having a molecular weight of 1000 (PPG-1000) to give a homogeneous solution. Various catalysts were added to aliquots of the above L-10/PPG-1000 mixture as recorded in Table 2.

The cure behavior of the samples was tested by differential scanning calorimetry (DSC) using a Model 912 Differential Scanning Calorimeter with a Model 2100 Thermal Analyst, both from TA Instruments of New Castle, Del. The samples were placed in hermetically sealed aluminum pans, the pans were placed into the testing apparatus, and the temperature was ramped from 20° C. to 300° C. at a rate of 100° C./minute. In all cases, a polymerization exotherm was observed. The onset and peak temperatures, shapes, and sizes (area under the exotherm curve) of the exotherms varied from sample to sample. The results are summarized in Table 2.

TABLE 2

| | | DSC | | |
|---|---|---|---|---|
| Catalyst | Wt % | Onset (°C.) | Peak (°C.) | Size (J/g) |
| none | 0 | 225 | 263 | 560 |
| $Cp_2TiCl_2$ | 0.26 | 125 | 186 | 547 |
| $Ni(AcAc)_3$[a] | 0.27 | 100 | 204 | 510 |
| $Zr(AcAc)_3$[a] | 0.26 | 160 | 192 | 522 |
| $Mn(AcAc)_3$[a] | 0.27 | 90 | 143 | 513 |
| $CpFe(CO)_2Cl$ | 0.26 | 90 | 137 | 455 |
| Zn Naphthenate[b] | 0.25 | 75 | 185 | 525 |
| Zn Naphthenate[b] | 2.13 | 50 | 117 | 383 |
| $[CpW(CO)_3]_2$ | 0.25 | 160 | 233 | 555 |
| $CpMn(CO)_2PPh_3$ | 0.25 | 125 | 143 | 565 |
| $(Anisole)Cr(CO)_3$ | 0.25 | 125 | 164 | 555 |
| $[CpMo(CO)_3]_2$ | 0.26 | 120 | 178 | 530 |
| $[CpFe(Pyrene)]SbF_6$ | 0.25 | 125 | 167 | 516 |
| $[CpFe(Xylene)]SbF_6$ | 0.25 | 160 | 208 | 498 |
| $MeCpMn(CO)_3$ | 0.25 | 150 | 198 | 545 |
| $[CpFe(CO)_2]_2$ | 0.25 | 105 | 123 | 574 |

[a]incomplete dissolution
[b]8% soluiton in mineral spirits

Table 2 shows that a variety of catalysts were effective in lowering the cure temperature of cyanate ester/polyol compositions and that organometallic catalysts were particularly effective. The sample containing 2.13 wt. % of zinc naphthenate had a smaller exotherm than other samples, indicating that the composition cured at a relatively lower temperature, prior to being heated by the testing apparatus; this indicated that the zinc naphthenate catalyst has poor latency.

EXAMPLE 4

Seven parts AroCy L-10 was mixed with three parts polypropylene glycol having an average molecular weight of 425 (PPG-425) to give a homogeneous solution. Catalysts according to Table 3 were added to aliquots of the above L-10/PPG425 mixture at 0.25% by weight. For each composition, 2 portions (each of approximately 5 mg) were placed in separate aluminum DSC pans. One pan was exposed for five minutes to the light of 2 (two), 15 watt fluorescent black lights (GE F15T8-BLB, 365 nm output, from General Electric, Schenectady, N.Y.) placed at a distance ½ inch from the pan. The pan was hermetically sealed after irradiation.

The second pan was hermetically sealed without having been exposed to the black lights. The cure exotherms were observed by DSC as described in Example 3 and the results are summarized in Table 3.

TABLE 3

| | UV | DSC | | |
|---|---|---|---|---|
| Catalyst | (min) | Onset (°C.) | Peak (°C.) | Size (J/g) |
| none | 0 | 180 | 249 | 616 |
| none | 5 | 180 | 241 | 588 |
| Zn Octoate[a] | 0 | 50 | 107 | 460 |
| Zn Octoate[a] | 5 | 60 | 109 | 336 |
| $Mn(AcAc)_3$[b] | 0 | 90 | 138 | 544 |
| $Mn(AcAc)_3$[b] | 5 | 90 | 139 | 520 |
| $[CpFe(CO)_2]_2$ | 0 | 100 | 127 | 570 |
| $[CpFe(CO)_2]_2$ | 5 | 90 | 131 | 463 |
| $MeCpMn(CO)_3$ | 0 | 150 | 191 | 579 |
| $MeCpMn(CO)_3$ | 5 | 100 | 141 | 520 |
| $[CpFe(Xylene)]SbF_6$ | 0 | 160 | 189 | 579 |
| $[CpFe(Xylene)]SbF_6$ | 5 | 120 | 156 | 582 |
| $[Fe(Mesitylene)_2]SbF_6]_2$ | 0 | 150 | 211 | 528 |

TABLE 3-continued

| Catalyst | UV (min) | DSC Onset (°C.) | DSC Peak (°C.) | DSC Size (J/g) |
|---|---|---|---|---|
| [Fe(Mesitylene)$_2$]SbF$_6$]$_2$ | 5 | 130 | 186 | 586 |
| Mn$_2$(CO)$_{10}$ | 0 | 120 | 156 | 556 |
| Mn$_2$(CO)$_{10}$ | 5 | 90 | 129 | 562 |

[a]8% solution in mineral spirits
[b]incomplete dissolution

Table 3 shows that the compositions of the present invention can be cured by either thermal or electromagnetic radiation; the organometallic compounds can act as thermal and photoinitiated catalysts for curing mixtures of cyanate esters and polyols. Table 3 shows further that that these mixtures can be cured in 2 stages. In the absence of an organometallic catalyst, the cyanate ester/polyol compositions did not show any ability to be photocured.

The smaller exotherm size for the zinc octoate samples reflected cure at ambient conditions before the DSC could be run, and indicated very poor latency for this catalyst.

EXAMPLE 5

Seven cyanate ester/polyol samples containing 0.25% by weight [CpFe(CO)$_2$]$_2$ were prepared with L-10/PPG-2000 (polypropylene glycol with average molecular weight of 2000) at weight ratios of 3/7, 4/6, 5/5, 6/4, 7/3, 8/2, and 9/1.

Three solutions containing L-10/PPG-1000 in weight ratios of 7/3, 8/2, and 9/1 containing 0.25% by weight [CpFe(CO)$_2$]$_2$ were prepared.

A sample of each different composition was placed between two steel shims (approximately 50×10×0.2 mm) which were then lightly clamped together with two paper clips. The L-10/PPG-2000 samples were cured for 2 hours in a 110° C. oven. The L-10/PPG-1000 samples were cured for one hour at 110° C.

All samples were analyzed by dynamic mechanical spectroscopy (DMS) using a Seiko DMS 110 interfaced with a Seiko SSC5200H Disk Station (both available from Seiko Instruments, Torrance Calif.) for data collection and analysis. The DMS for the above constrained layer samples were obtained in a double cantilever beam mode using the flexural fixture of the DMS 110 at a frequency of 1 Hz using a 10° C./minute temperature ramp. Two scans were run for each sample and the temperature corresponding to the peak of the tan δ curve in the resulting DMS of each constrained layer sample was taken as the glass transition temperature (Tg) of the polymer in the sample. A peak width could be defined by the temperatures on either side of the peak corresponding to a tan δ value of 0.06. A single tan δ peak for a sample indicates a homogenous, single-phase reaction product; i.e., samples having a single tan δ peak did not phase separate upon curing.

The DMS scans for the 3/7 and 4/6 L-10/PPG-2000 ratio samples were run from −100° to 200° C. The DMS scans for the other samples were run from −100° C. to 300° C. The results are summarized in Table 4.

TABLE 4

| | Tan δ (2nd scan) Peak (°C.) | Tan δ (2nd scan) Width (°C.)[a] |
|---|---|---|
| L-10/PPG-2000 Ratio | | |
| 3/7 | −14 | 38 |
| 4/6 | 23 | 68 |
| 5/5[b] | −30 | 15 |
| | 194 | 24 |
| 6/4[b] | −34 | not applicable[c] |
| | 188 | 23 |
| 7/3 | 197 | 23 |
| 8/2 | 209 | 42 |
| 9/1 | 247 | 27 |
| L-10/PPG-1000 Ratio | | |
| 7/3 | 212 | 57 |
| 8/2 | 231 | 30 |
| 9/1 | 241 | 33 |

[a]Temperature where tan δ is 0.06 or greater
[b]two peaks observed
[c]peak was below 0.06 tan δ

Table 4 shows that a wide range of physical properties, as reflected by Tg, were obtained by varying the cyanate ester monomer/polyol ratio. Table 4 further shows that a wide range of physical properties, as reflected by Tg, were obtained by varying the nature of the polyol, here, the average molecular weight of the polyol.

All samples were homogeneous. Except for the 5/5 and 6/4 ratio L-10/PPG-2000 samples, all of the cured polymers were not phase separated. Analysis of the tan δ curves of the 5/5 and 6/4 ratio L-10/PPG-2000 samples showed the presence of 2 phases in these homogeneous cured reaction product, a low temperature phase probably dominated by the polyol and a high temperature phase probably dominated by the cyanate ester monomer.

EXAMPLE 6

Small aliquots, approximately 0.5 g, of each of the seven different L-10/PPG-2000/[CpFe(CO)$_2$]$_2$ compositions from Example 5 were placed in individual aluminum weighing pans and cured in a 120° C. oven for 2 hours. The cured polymers were removed and their physical appearance and handling characteristics were observed.

The 3/7 ratio sample formed a tacky, transparent brown colored, soft solid which could be indented with a fingernail. The polymer was very flexible and tended to adhere to itself and the aluminum pan. The 4/6 ratio sample formed a soft, slightly tacky, transparent brown colored, flexible film which could be indented with a fingernail.

The 5/5 ratio sample formed a soft, transparent brown colored, flexible film which could be bent without breaking. It was not tacky and was harder than the 4/6 ratio sample but could still be indented with a fingernail. The 6/4 ratio sample formed a hard, murky brown colored, flexible film that could be bent without breaking. The 5/5 ratio sample and the 6/4 ration sample were homogeneous in appearance, and showed no sign of gross phase separation.

The 7/3 ratio sample formed a hard, transparent brown colored, somewhat flexible film which broke upon bending. The 8/2 ratio sample formed a hard, transparent brown colored, slightly flexible film which broke more readily than the 7/3 ratio sample upon bending. The 9/1 ratio sample formed a hard, transparent brown colored, slightly flexible film which broke more readily than the 8/2 ratio sample upon bending.

This example showed that a wide variety of physical properties were obtained by varying the cyanate/polyol ratios and that the properties reflected the Tg trend shown in Example 5. The murky color of the 6/4 ratio sample was consistent with some phase separation but the phase domains appeared to be quite small, no gross phase separation, such as the formation of distinct layers, was observed with of these compositions. The 5/5 ratio sample showed no evidence visible to the unaided eye of phase separation indicating that the phase separation observed by DMS in Example 5 involves very small phase domains.

EXAMPLE 7

A sample of one part L-10, one part PPG-1000, and 0.25% by weight $[CpFe(CO)_2]_2$ was cured as a film on a perfluoropolyethylene surface for 1 hour at 75° C. followed by 1 hour at 100° C. A 10 mg portion was cut from the film and subjected to thermogravametric analysis (TGA) in an air atmosphere using a Model 951 Thermogravimetric Analyzer integrated with a Model 2100 Thermal Analyst (both available from AT Instruments), for data collection and analysis. The temperature of the sample was ramped from 20° C. to 600° C. at a rate of 10°/minute and the change in weight of the sample was monitored. Approximately 2% of the original sample weight had been lost when the temperature of the sample reached 260° C., 5% had been lost at 285° C., and 10% had been lost at 305° C. Approximately 90% of the original sample weight had been lost by the time 500° C. was reached.

The TGA of a second 10 mg sample was run under an $N_2$ atmosphere. In this case, approximately 2% of the original sample weight had been lost when the temperature of the sample reached 265° C., 5% had been lost at 295° C., and 10% had been lost at 315° C. The char yield under $N_2$ was about 17%.

This example showed that the cyanate ester/polyol compositions of the present invention have reasonable high temperature stability in air and that the stability was slightly improved in an inert atmosphere.

EXAMPLE 8

Samples containing 1 part AroCy cyanate ester, 1 part polyol, and 0.25% by weight $[CpFe(CO)_2]_2$ where the cyanate ester was AroCy L-10, B-30, or XU-366, and polyol was PPG-425, PPG-725, PPG-1000, PPG-2000, or PPG-3000 were prepared according to Table 5. The samples were cured as 0.6–0.8 mm thick films for 1 hour at 75° C. followed by 1 hour at 100° C. Dogbones (9×63 mm, 3×12 mm neck area) were stamped from these homogeneous, transparent films and their tensile properties were analyzed on an Instron 1122 load frame using a 5 KN load cell (both from Instron of Canton Mass.) at a crosshead speed of 25 mm/minute. The slope of the stress/strain curve at low elongation was recorded as the modulus of the polymer. The distance the crosshead had traveled at the point where the dogbone broke was recorded as the percent elongation to break. The values for at least 5 dogbones were averaged to obtain the modulus and percent elongation to break values for each formulation. The results are summarized in Table 5.

TABLE 5

| Cyanate ester | PPG | Modulus (MPa) | Break Elongation (%) |
|---|---|---|---|
| L-10 | 425 | 1 | 344 |
| L-10 | 725 | 23 | 169 |
| L-10 | 1000 | 36 | 127 |
| L-10 | 2000 | 96 | 69 |
| L-10 | 3000 | 81 | 40 |
| XU-366 | 1000* | 0.5 | 330 |
| B-30 | 425 | 34 | 102 |

*this sample was cured for an additional 30 minutes at 150° C.

Table 5 shows that the rheological properties of cured cyanate ester/polyol compositions were varied by changing the molecular weight of the polyol used in the energy-polymerizable composition. Table 5 also shows that changing the cyanate ester component changes the rheological properties of the cured composition.

EXAMPLE 9

Dogbones of three L-10/PPG-3000 compositions containing 0.25% by weight $[CpFe(CO)_2]_2$ with cyanate ester/polyol ratios of 4/6, 5/5, and 6/4 were prepared and analyzed as described in Example 8. The results are summarized in Table 6.

TABLE 6

| L-10/PPG-3000 | Modulus (MPa) (MPa) | Break Elongation (%) |
|---|---|---|
| 4/6 | 2 | 61 |
| 5/5 | 81 | 40 |
| 6/4 | 285 | 19 |

Table 6 shows that the Theological properties of cured cyanate ester/polyol compositions were varied by changing the cyanate ester/polyol ratio of the energy-polymerizable composition.

EXAMPLE 10

A film of 1 part L-10, 1 part PPG-2000, and 0.25% by weight $[CpFe(CO)_2]_2$ was cured as in Example 8 except that the film was heated in a 100° C. oven for 24 hours instead of 1 hour. Dogbones were stamped from this film and divided into 4 groups of 3 dogbones each. The first set was the control set and its tensile properties were determined as described in Example 8. The remaining 3 sets were placed in boiling distilled water for one hour. Tensile tests were done on one set of dogbones immediately after removal from the boiling water and patting dry with a lint free paper tissue. The other two sets were also patted dry and then placed in a 100° C. oven. One set was removed after 2 hours. Its tensile properties were analyzed. The last set was removed and tested after 17 hours in the oven. The results are summarized in Table 7.

TABLE 7

| Water Boil (Hrs) | 100° C. Drying (hrs) | Modulus (MPa) | Break Elongation (%) |
|---|---|---|---|
| 0 | 0 | 90 | 80 |
| 1 | 0 | 33 | 88 |
| 1 | 2 | 91 | 97 |
| 1 | 17 | 87 | 89 |

The data from this example shows that the rheological properties of cured cyanate ester/polyol compositions were affected by exposure to water but that the effects were essentially reversible and the cured polymers were not significantly degraded. The data show that the polyol did not leach out of the cured composition during extended exposure to boiling water, or the subsequent drying at elevated temperatures. It is believed that in the present invention, the polyol is chemically incorporated into the cured polymer matrix.

What is claimed is:

1. A method of producing a cured homogeneous composition comprising the steps of:

providing an energy-polymerizable composition comprising:

a cyanate ester monomer or oligomer comprising an organic radical bonded through carbon atoms to at least two -OCN groups;

a low molecular weight polyalkylene glycol; and an organometallic compound in which at least one carbon atom of an organic group is bonded to a metal atom; and effecting polymerization of the composition by at least one of thermal energy, radiation, and accelerated particles.

2. The method of claim 1, wherein the energy-polymerizable composition is produced by the steps of:

mixing the organometallic compound with the polyalkylene glycol; and mixing the organometallic compound/polyalkylene glycol mixture with the cyanate ester monomer or oligomer.

3. The method of claim 1, wherein the energy-polymerizable composition is cured in a multiple-step process comprising:

an irradiation step wherein the organometallic compound is activated; and a thermal step wherein the activated composition is polymerized.

4. The method of claim 1, wherein the cyanate ester monomer has the general formula

Q(OCN)$_p$ where p is an integer from 2 to 7, and Q comprises a mono-, di-, tri-, or tetravalent aromatic hydrocarbon containing from 5 to 30 carbon atoms and zero to 5 aliphatic, cyclic aliphatic, or polycyclic aliphatic, mono-, di-, or trivalent hydrocarbon linking groups containing 7 to 20 carbon atoms.

5. The method of claim 1, wherein the cyanate ester oligomer is comprised of partially cyclotrimerized cyanate ester monomers of claim 4.

6. The method of claim 1, wherein the cyanate ester monomer or oligomer is chosen from the group consisting of: 1,1-bis-(4-cyanatophenyl)ethane, 2,2-bis(4-cyanatophenyl)propane, bis(3,5-dimethyl-4-cyanatophenyl) methane, 4,4'-(1,3-phenylenediisopropylidene) diphenylcyanate, cyanated novolac oligomers, and polyaromatic cyanate ester oligomers containing polycyclic aliphatic diradicals.

7. The method of claim 1, wherein the energy-polymerizable composition further comprises a monofunctional cyanate ester monomer.

8. The method of claim 1, wherein the organometallic compound has the general formula:

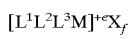

[L$^1$L$^2$L$^3$M]$^{+e}$X$_f$ wherein:

L$^1$ represents none or 1 to 12 ligands contributing pi-electrons that can be the same or different selected from cyclic or acyclic aromatic, heteroaromatic, or unsaturated compounds and groups, each capable of contributing 2 to 24 pi-electrons to the valence shell of M;

L$^2$ represents none or 1 to 24 ligands that can be the same or different, each contributing 2, 4, or 6 electrons selected from mono-, di-, and tridentate ligands to the valence shell of M;

L$^3$ represents none or 1 to 12 ligands that can be the same or different, each contributing no more than one electron to the valence shell of each M;

M represents from 1 to 6 of the same or different metal atoms selected from Ti, Zr, Hf, V, Nb, Ta, Cr, Mo, W, Mn, Tc, Re, Fe, Ru, Os, Co, Rh, Ir, Ni, Pd, and Pt;

e is an integer from 0 to 2 such that the organometallic portion of the molecule is neutral, cationic, or dicationic;

X is an anion selected from organic sulfonate and halogenated, alkylated, or arylated metal or metalloid groups;

f is an integer from 0 to 2 and is the number of anions required to balance the charge e on the organometallic portion of the molecule;

with the proviso that the organometallic compound contains at least one transition metal to carbon bond and that L$^1$, L$^2$, L$^3$, M, e, X, and f are chosen so as to achieve stable configuration.

9. The method of claim 1, wherein the organometallic catalyst is chosen from the group consisting of: [CpFe(CO)$_2$]$_2$, Mn$_2$(CO)$_{10}$, [MeCpMo(CO)$_3$]$_2$, [CpFe(xylene)][SbF$_6$], [CpFe(cumene)][PF$_6$], MeCpMn(CO)$_3$, CpFe(CO)$_2$Cl, (benzene)Cr(CO)$_3$, Cp$_2$TiCl$_2$, MeCpMn(CO)$_2$PPh$_3$, Mn(CO)$_5$Br, [MeCpMn(CO)$_2$NO]PF$_6$, and (anisole)Cr(CO)$_3$.

10. The method of claim 9, wherein the organometallic catalyst is chosen from the group consisting of [CpFe(CO)$_2$]$_2$, MeCpMn(CO)$_3$, Mn(CO)$_5$Br, Mn$_2$(CO)$_{10}$, and [CpFe(cumene)][PF$_6$].

11. The method of claim 1, wherein the polyalkylene glycol includes a repeating alkylene unit containing 2, 3, or 4 carbon atoms.

12. The method of claim 1, wherein the polyalkylene glycol is a polyethylene glycol.

13. The method of claim 12, wherein the average molecular weight of the polyethylene glycol is in the range from about 200 to 4,000.

14. The method of claim 1, wherein the polyalkylene glycol is a polypropylene glycol.

15. The method of claim 14, wherein the average molecular weight of the polypropylene glycol is in the range from about 400 to 4,000.

16. The method of claim 1, wherein the polyalkylene glycol is a polypropylene glycol triol.

17. The method of claim 16, wherein the average molecular weight of the polypropylene glycol triol is in the range from about 300 to 6,000.

18. The method of claim 1, wherein the polyalkylene glycol is a polybutylene glycol.

19. The method of claim 18, wherein the average molecular weight of the polybutylene glycol is in the range from about 600 to 3,000.

20. An energy-polymerizable composition comprising:

a cyanate ester monomer or oligomer comprising an organic radical bonded through aromatic carbon atoms to at least two -OCN groups;

a low molecular weight polyalkylene glycol; and an organometallic compound in which at least one carbon atom of an organic group is bonded to a metal atom.

21. The composition of claim 20, wherein the organometallic compound has the general formula:

$$[L^1 L^2 L^3 M]^{+e} X_f$$

wherein:

- $L^1$ represents none or 1 to 12 ligands contributing pi-electrons that can be the same or different selected from cyclic or acyclic aromatic, heteroaromatic, or unsaturated compounds and groups, each capable of contributing 2 to 24 pi-electrons to the valence shell of M;
- $L^2$ represents none or 1 to 24 ligands that can be the same or different, each contributing 2, 4, or 6 electrons selected from mono-, di-, and tridentate ligands to the valence shell of M;
- $L^3$ represents none or 1 to 12 ligands that can be the same or different, each contributing no more than one electron to the valence shell of each M;
- M represents from 1 to 6 of the same or different metal atoms selected from Ti, Zr, Hf, V, Nb, Ta, Cr, Mo, W, Mn, Tc, Re, Fe, Ru, Os, Co, Rh, Ir, Ni, Pd, and Pt;
- e is an integer from 0 to 2 such that the organometallic portion of the molecule is neutral, cationic, or dicationic;
- X is an anion selected from organic sulfonate and halogenated, alkylated, or arylated metal or metalloid groups;
- f is an integer from 0 to 2 and is the number of anions required to balance the charge e on the organometallic portion of the molecule;
- with the proviso that the organometallic compound contains at least one transition metal to carbon bond and that $L^1$, $L^2$, $L^3$, M, e, X, and f are chosen so as to achieve stable configuration.

* * * * *